US008628982B2

(12) United States Patent
Sung et al.

(10) Patent No.: US 8,628,982 B2
(45) Date of Patent: Jan. 14, 2014

(54) METHOD OF DEPOSITING AND INSPECTING AN ORGANIC LIGHT EMITTING DISPLAY PANEL

(75) Inventors: Un-Cheol Sung, Yongin (KR); Beohm-Rock Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 204 days.

(21) Appl. No.: 12/929,822

(22) Filed: Feb. 17, 2011

(65) Prior Publication Data

US 2011/0207244 A1 Aug. 25, 2011

(30) Foreign Application Priority Data

Feb. 22, 2010 (KR) ........................ 10-2010-0015803

(51) Int. Cl.
*H01L 21/66* (2006.01)
*H01L 35/24* (2006.01)
*B05C 11/00* (2006.01)

(52) U.S. Cl.
USPC ........ 438/7; 438/16; 438/99; 257/40; 257/48; 118/712

(58) Field of Classification Search
None
See application file for complete search history.

(56) References Cited

U.S. PATENT DOCUMENTS

| | | | |
|---|---|---|---|
| 6,406,924 B1 | 6/2002 | Grimbergen et al. | |
| 2002/0009814 A1 | 1/2002 | Usui et al. | |
| 2003/0090669 A1 | 5/2003 | Jung et al. | |
| 2005/0227385 A1 | 10/2005 | Tan | |
| 2007/0121124 A1 | 5/2007 | Nabatova-Gabain et al. | |
| 2007/0148351 A1* | 6/2007 | Yamazaki et al. | 427/255.5 |
| 2009/0075411 A1* | 3/2009 | Yamazaki et al. | 438/29 |
| 2011/0132260 A1* | 6/2011 | Yamazaki et al. | 118/719 |

FOREIGN PATENT DOCUMENTS

| | | | |
|---|---|---|---|
| JP | 2002-081917 | A | 3/2002 |
| JP | 2002-512447 | A | 4/2002 |
| JP | 2003-042722 | A | 2/2003 |
| JP | 2003-066400 | A | 3/2003 |
| JP | 2003-114107 | A | 4/2003 |
| JP | 2005-310636 | A | 11/2005 |
| JP | 2005-322612 | A | 11/2005 |
| JP | 2007-095458 | A | 4/2007 |
| JP | 2007-273363 | A | 10/2007 |
| JP | 2009-075044 | A | 4/2009 |
| JP | 2009-250877 | A | 10/2009 |
| JP | 2009-301768 | A | 12/2009 |
| KR | 10 2003-0032433 | A | 4/2003 |
| WO | WO 99/54926 | A1 | 10/1999 |
| WO | WO 00/60657 | A1 | 10/2000 |

OTHER PUBLICATIONS

Japanese Office Action in JP 2010-248667, dated Jan. 31, 2012 (Sung, et al.).
Japanese Office Action in JP 2010-248667, dated Jun. 5, 2012 (Sung, et al.).

* cited by examiner

*Primary Examiner* — Alonzo Chambliss
(74) *Attorney, Agent, or Firm* — Lee & Morse, P.C.

(57) ABSTRACT

An apparatus for depositing and inspecting an organic light emitting display panel includes a depositor part configured to deposit thin film layers on a panel, the thin film layers including an anode layer, an organic film layer, and a cathode layer, and an inspector part configured to measure spectra of light reflected from the thin film layers, compare the measured spectra to reference spectra, and determine thickness correctness of individual thin film layers.

12 Claims, 8 Drawing Sheets

METHOD OF DEPOSITING AND INSPECTING AN ORGANIC LIGHT EMITTING DISPLAY PANEL

BACKGROUND

1. Field

Example embodiments relate to an apparatus for depositing and inspecting an organic light emitting display panel, and a method of depositing and inspecting an organic light emitting display panel by using the apparatus.

2. Description of the Related Art

Thin, e.g., portable, flat panel display apparatuses, e.g., light emitting display apparatuses that are emissive display apparatuses, have recently received attention as display apparatuses with good characteristics, e.g., wide viewing angle, high contrast ratio, and short response times. Also, organic light emitting display apparatuses, i.e., in which a light emitting layer is formed of an organic material, are superior to inorganic light emitting display apparatuses, i.e., in which a light emitting layer is formed of an inorganic material, in terms of brightness, driving voltage, response time characteristics, and multi-color display.

An organic light emitting display apparatus includes a thin film transistor (TFT) and an organic light emitting device driven by the TFT. The organic light emitting device may include an anode layer, an organic film layer, and a cathode layer that are sequentially stacked. Thus, when a voltage is applied between the anode layer and the cathode layer of the organic light emitting device by driving the TFT, an energy difference is formed in the organic film layer, and accordingly, an emissive layer included in the organic film layer generates light. Each of the layers of the organic light emitting device may be formed by a deposition method.

SUMMARY

Embodiments are directed to an apparatus for depositing and inspecting an organic light emitting display panel and a method of using the same, which substantially overcome one or more of the problems due to the limitations and disadvantages of the related art.

It is therefore a feature of an embodiment to provide an apparatus for depositing and inspecting an organic light emitting display panel by determining correctness of a layer deposition thickness during a deposition process.

It is therefore another feature of an embodiment to provide a method of depositing and inspecting a thickness of a thin film layer during a deposition process by using the apparatus.

At least one of the above and other features and advantages may be realized by providing an apparatus for depositing and inspecting an organic light emitting display panel, the apparatus including a depositor part configured to deposit thin film layers on a panel, the thin film layers including an anode layer, an organic film layer, and a cathode layer, and an inspector part configured to measure spectra of light reflected from the thin film layers, compare the measured spectra to reference spectra, and determine thickness correctness of individual thin film layers.

The inspector part may include a reflectometer for radiating light onto the thin film layers and receiving reflection light reflected by the thin film layers, a computer for determining whether the thickness of each of the thin film layers is correct or not by analyzing spectrums of the reflection light received by the reflectometer, and a controller for controlling the deposition process in response to the analysis result of the computer.

The computer may compare a measured spectrum of reflection light received by the reflectometer to a reference spectrum that is set in the computer, and determines whether the deposition thickness is correct or not by inspecting one of the change of location of the peak wavelength, the change of magnitude of the minimum refractive index, and the change of a full width at half maximum.

The controller may remove a panel that is determined as a defective by the computer from the deposition process and gives a warning notice to the operator.

The depositor part may include a plurality of process chambers in which the deposition of the thin film layers is performed, a plurality of carrying chambers each having a carrying device for conveying the panel to the process chambers, and a buffer chamber for connecting the adjacent carrying chambers, wherein the inspector part is installed in one of the above chambers.

The inspector part may be configured to operate after deposition of each of the organic film layer and the cathode layer.

The inspector part may be configured to operate multiple times during a deposition process of a single panel, the inspector part being configured to operate after deposition of each of the organic film layer and the cathode layer on the single panel.

The inspector may be configured to operate before deposition completion of all of the thin film layers.

The inspector part may be configured to determine a thickness of each layer in the organic film layer and the cathode layer separately.

At least one of the above and other features and advantages may also be realized by providing a method of depositing and inspecting an organic light emitting display panel, the method including depositing on a panel thin film layers including an anode layer, an organic film layer, and a cathode layer, measuring spectra of a reflection light by irradiating light onto the thin film layers, and determining whether the thickness of each of the thin film layers is correct or not by comparing the measured spectra of reflection light to reference spectra.

The determining whether the thickness of each of the thin film layers is correct or not may include one of determining the change of location of the peak wavelength, determining the change of magnitude of the minimum refractive index, and determining the change of a full width at half maximum.

The method may further include controlling the depositing according to the determination result in the determining process.

The controlling the deposition may include removing a panel determined to be defective from the deposition process and providing a warning notice to the operator.

In the depositing, the anode layer, the organic film layer, and the cathode layer may be sequentially deposited in that order, and the measuring, determining, and controlling may be performed whenever each of the thin film layers is deposited after the organic film layer is deposited.

The depositing of the thin film layers may further include depositing a protective capping layer on the cathode layer.

In the measuring of a spectrum of a reflection light, light may be irradiated onto the thin film layers in a direction from the cathode layer to the anode layer.

In the measuring a spectrum of a reflection light, light may be irradiated onto the thin film layers in a direction from the anode layer to the cathode layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
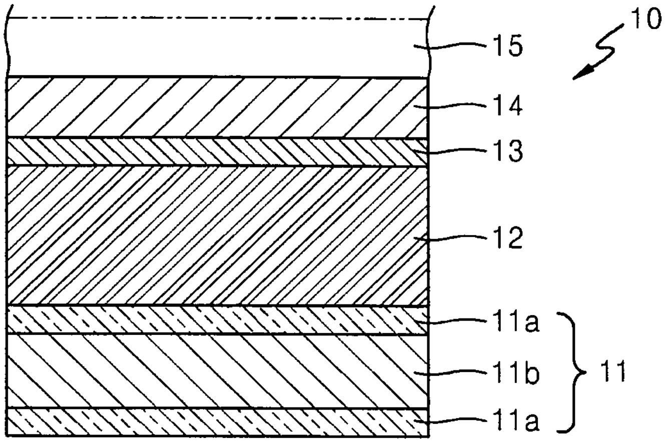
FIGS. 1A and 1B illustrate schematic cross-sectional diagrams of top and bottom emission type organic light emitting display panels, respectively.

Korean Patent Application No. 10-2010-0015803, filed on Feb. 22, 2010, in the Korean Intellectual Property Office, and entitled: "Apparatus for Depositing and Inspecting Organic Light Emitting Display Panel and Method of Depositing and Inspecting Organic Light Emitting Display Panel by Using the Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
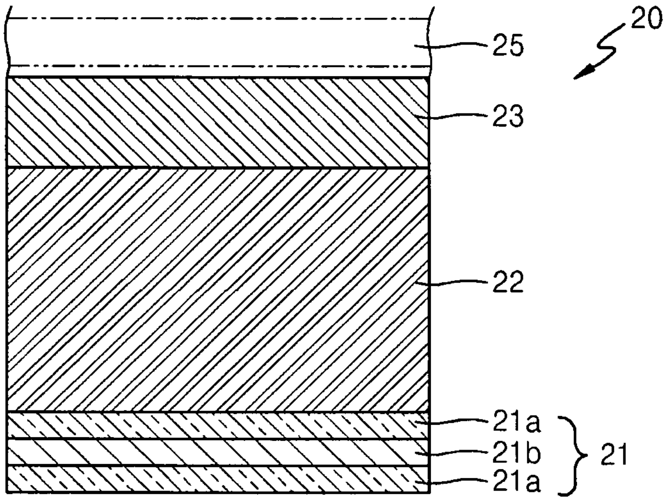

FIGS. 1A and 1B illustrate respective cross-sectional views of top and bottom emission type organic light emitting display panels included in an organic light emitting display device.

Referring to FIG. 1A, a top emission type organic light emitting display panel 10 may have a structure in which an organic film layer 12, a cathode layer 13, and a capping layer 14 are sequentially deposited on an anode layer 11. The anode layer 11 may be formed by alternately stacking ITO layers 11*a* and Ag layers 11*b*, where the Ag layer 11*b* functions as a reflection layer to reflect light emitted from the organic film layer 12 toward the front, i.e., toward the capping layer 14.

Although not shown in detail, the organic film layer 12 may include a hole injection layer (HIL), a hole transport layer (HTL), an emission material layer (EML), an electron transport layer (ETL), and an electron injection layer (EIL). Light emission is realized through a process of combining the holes and electrons in the EML. The EML may include one of a red EML, a green EML, and a blue EML according to the color of light emitted from the EML, so a color image is realized by combining lights emitted from adjacently disposed organic light emitting display panels respectively having the EMLs of the three colors.

The cathode layer 13 may be a semi-transparent layer formed of an alloy of Mg and Ag, and may transmit light emitted from the organic film layer 12. The capping layer 14 formed on the cathode layer 13 may be a transparent layer and may transmit light. The top emission type organic light emitting display panel 10 may also include an encapsulation layer 15.

Although not shown, a TFT for driving the top emission type organic light emitting display panel 10 may be disposed under the anode layer 11. Accordingly, when voltage is applied between the anode layer 11 and the cathode layer 13 by the TFT, light is emitted from the organic film layer 12 and proceeds toward the capping layer 14.

Referring to FIG. 1B, a bottom emission type organic light emitting display panel 20 may have a structure in which an organic film layer 22 and a cathode layer 23 are sequentially stacked on an anode layer 21. The anode layer 21 may be formed by alternately stacking ITO layers 21*a* and Ag layers 21*b*. The Ag layer 21*b* of the bottom emission type organic light emitting display panel 20 may be thinner than the Ag layer 11*b* of the top emission type organic light emitting display panel 10, so light generated from the organic film layer 22 may be transmitted toward a bottom side of the bottom emission type organic light emitting display panel 20, i.e., toward the anode layer 21.

The organic film layer 22, like the organic film layer 12, may also include an HIL, an HTL, an EML, an ETL, and an EIL, and light emission may be realized through a process of combining the holes and electrons in the EML. The EML may include one of a red EML, a green EML, and a blue EML according to the color of light emitted from the EML, and a color image is realized by combining lights emitted from adjacently disposed organic light emitting display panels respectively having the EMLs of the three colors.

The cathode layer 23 may be a reflection layer formed of Al and may reflect light generated from the organic film layer 22 toward the anode layer 21. The bottom emission type organic light emitting display panel 20 may also include an encapsulation layer 25, and a TFT for driving the bottom emission type organic light emitting display panel 20 may be formed under the anode layer 21. Accordingly, when voltage is applied between the anode layer 21 and the cathode layer 23 by the TFT, light is generated from the organic film layer 22 and proceeds toward the anode layer 21.

Conventionally, a quality of either of the top or bottom emission type organic light emitting display panels 10 or 20 is inspected through a light emission test after all of the deposition processes, i.e., all of the layers, are completed and encapsulation layers 15 and 25 for sealing the organic light emitting devices are formed. That is, a voltage is applied between the anode layers 11 and 21 and the respective cathode layers 13 and 23 after the fabrication processes of the organic light emitting display panels 10 and 20 are completed, so light emitted from the organic light emitting display panels 10 and 20 may be examined. It is noted that poor product quality refers to characteristics of emitted light that deviate from a desired range, e.g., due to inaccurate film thickness deposition of one or more of the layers stacked in the organic light emitting display panel, thereby exhibiting inaccurate color image.

However, as the product quality is conventionally inspected after process completion, poor product quality, e.g., product defects, may be detected and confirmed only when fabrication of the organic light emitting display panel is complete. Therefore, when a product failure is confirmed, there may be a high possibility that all of the completed and intermediate products that have already undergone the deposition process are defective products.

Figure 2:
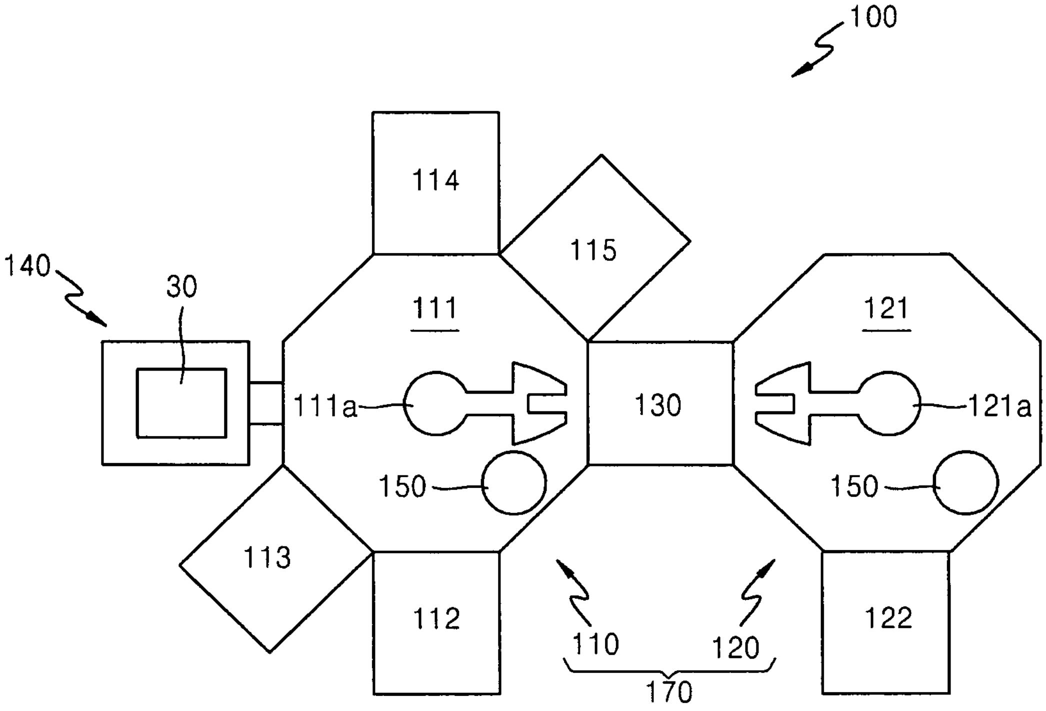
FIG. 2 illustrates a schematic plan view of an apparatus for depositing and inspecting a thin film layer of an organic light emitting display panel according to an embodiment.
Figure 3:
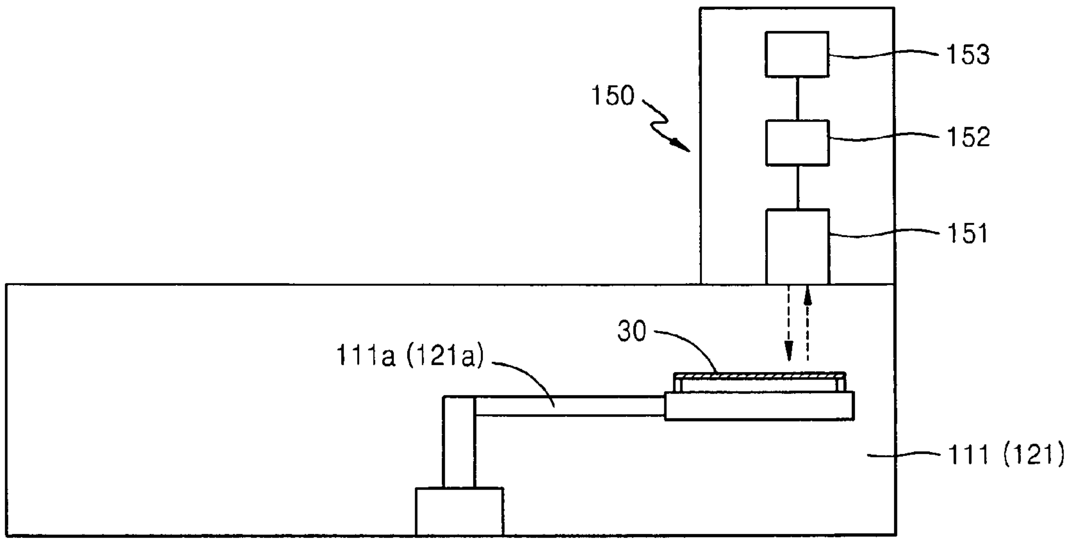
FIG. 3 illustrates a schematic cross-sectional view of the apparatus in FIG. 2.

Therefore, according to example embodiments, a deposition and inspection apparatus 100 configured to inspect products, e.g., in terms of thickness accuracy, in each stacking process during deposition, i.e., before product completion, will be described hereinafter with reference to FIGS. 2 and 3. FIGS. 2 and 3 illustrate respective schematic top-plan and cross-sectional views of the apparatus 100.

Referring to FIGS. 2-3, the apparatus 100 may include a depositor part 170 for performing deposition and an inspector part 150 for inspecting deposited films. The depositor part 170 will be described with reference to FIG. 2 and the inspector part 150 will be described with reference to FIG. 3.

Referring to FIG. 2, the depositor part 170 in the apparatus 100 may include a plurality of process chambers 112, 113, 114, 115, and 122 around carrying chambers 111 and 121 on which returning devices 111*a* and 121*a* are formed, respectively. For example, the returning devices 111*a* and 121*a* may be robot arms positioned in the respective carrying chambers 111 and 121, and may be configured to rotate and move, e.g., in a straight direction, in order to convey a panel 30 to a corresponding process chamber, e.g., one or more of the process chambers 112, 113, 114, 115, and 122. Thus, when a panel 30 is supplied to the returning devices 111*a* and 121*a* from a panel supply unit 140, the returning devices 111*a* and 121*a* may deliver the panel 30 to a corresponding process chamber of the process chambers 112, 113, 114, 115, and 122. Then, deposition processes may be performed in each of the process chambers 112, 113, 114, 115, and 122.

In detail, the apparatus 100 may have a structure in which two carrying chambers, i.e., first and second carrying chambers 111 and 121, may be connected to each other via a buffer chamber 130. Hereinafter, a combination of the first carrying chamber 111 with the process chambers 112, 113, 114, and 115 attached to and surrounding the first carrying chamber 111 will be referred to as a first cluster 110. Similarly, a combination of the second carrying chamber 121 with the process chamber 122 attached thereto will be referred to as a second cluster 120. The first cluster 110 may be positioned on a left side of the buffer chamber 130, and the second cluster 120 may be positioned on a right side of the buffer chamber 130. When the deposition processes in the first cluster 110 are completed, the panel 30 may be conveyed to the second cluster 120 through the buffer chamber 130, and a subsequent deposition process may be performed in the second cluster 120. It is noted that even though only two clusters, i.e., the first and second clusters 110 and 120, are described in the present embodiment, the number of clusters may be increased according to the deposition processes. The first and second clusters 110 and 120 with the buffer chamber 130 may define the depositor part 170.

For example, when the top emission type organic light emitting display panel 10 of FIG. 1A is formed on the panel 30 on which a TFT is formed, the ITO layer 11*a* and the Ag layer 11*b* of the anode layer 11 may be respectively deposited in the process chambers 112 and 113. Further, the organic film layer 12 may be deposited in the process chamber 114 of the first cluster 110, the cathode layer 13 may be deposited in the process chamber 115 of the first cluster 110, and the capping layer 14 may be formed in the process chamber 122 of the second cluster 120. Therefore, on the panel 30 that enters the first cluster 110 from the panel supply unit 140, the anode layer 11, the organic film layer 12, and the cathode layer 13 may be sequentially deposited in the first carrying chamber 111, while the panel 30 is being sequentially conveyed by the returning device 111*a* through the process chambers 112 through 115. Then, the capping layer 14 may be deposited on the panel 30 in the process chamber 122 after the panel 30 is conveyed to the second cluster 120. It is noted that as the organic film layer 12 has a stack structure in which a plurality of layers are stacked as described above, the entire organic film layer 12 may be formed in the process chamber 114 or the number of process chambers and clusters may be increased to form each of the layers of the organic film layer 12 in a separate process chamber.

As further illustrated in FIG. 2, the apparatus 100 may include the inspector part 150 for inspecting whether the layers deposited by the depositor part 170 have a desired thickness. The inspector part 150 may be installed on the depositor part 170, e.g., on each of the first and second carrying chambers 111 and 121. It is noted that even though the inspector part 150 in FIGS. 2 and 3 is illustrated on the first and second carrying chambers 111 and 121, other configurations are within the scope of the example embodiments, e.g., the inspector part 150 may be positioned on one of the process chambers 112, 113, 114, 115, and 122 or on the buffer chamber 130.

The inspector part 150 is configured to inspect an object by measuring a spectrum of light reflected from the object after irradiating light onto the object. That is, a predetermined spectrum of reflected light is emitted from each deposition layer. Therefore, a change in deposition thickness modifies the spectrum of the reflected light, so the inspector part 150 may determine whether the deposition thickness is correct, e.g., accurate, or not by measuring a spectrum of reflected light.

In detail, referring to FIG. 3, the inspector part 150 may include a reflectometer 151 for radiating light onto an object, i.e., onto the panel 30, and receiving the reflected light, a processor, i.e., a computer 152, for determining whether the deposition thickness is correct or not by analyzing spectra of the reflected light received by the reflectometer 151, and a controller 153 for controlling the deposition process in response to the analysis result of the computer 152. The reflectometer 151 may be positioned to overlap the panel 30. The computer 152 may be connected to the reflectometer 151, and may analyze the spectra of the reflected light based on the reflected light received by the reflectometer 151. When the product is determined as defective, i.e., when the computer 152 determines that a thickness of a deposited layer deviates from a desired range based on the spectra of the reflected light, the controller 153 may control the process to remove, e.g., immediately remove, the corresponding product, i.e., the panel 30 with the defective layer. Also, the controller 153 may generate a warning message to the operator, e.g., to take an appropriate action, with respect to the ongoing deposition process.

The computer 152 may store, e.g., include a database with, reference spectra for comparing with the measured spectra of the reflected light received by the reflectometer 151. That is, a spectrum of reflected light that is emitted from each layer with an accurate thickness, i.e., a layer with a thickness within a desired range, may be stored as a reference spectrum in the computer 152. Then, an actually measured spectrum may be compared to the reference spectrum to determine whether the actually measured spectrum is within the reference range or not.

Figure 4A:
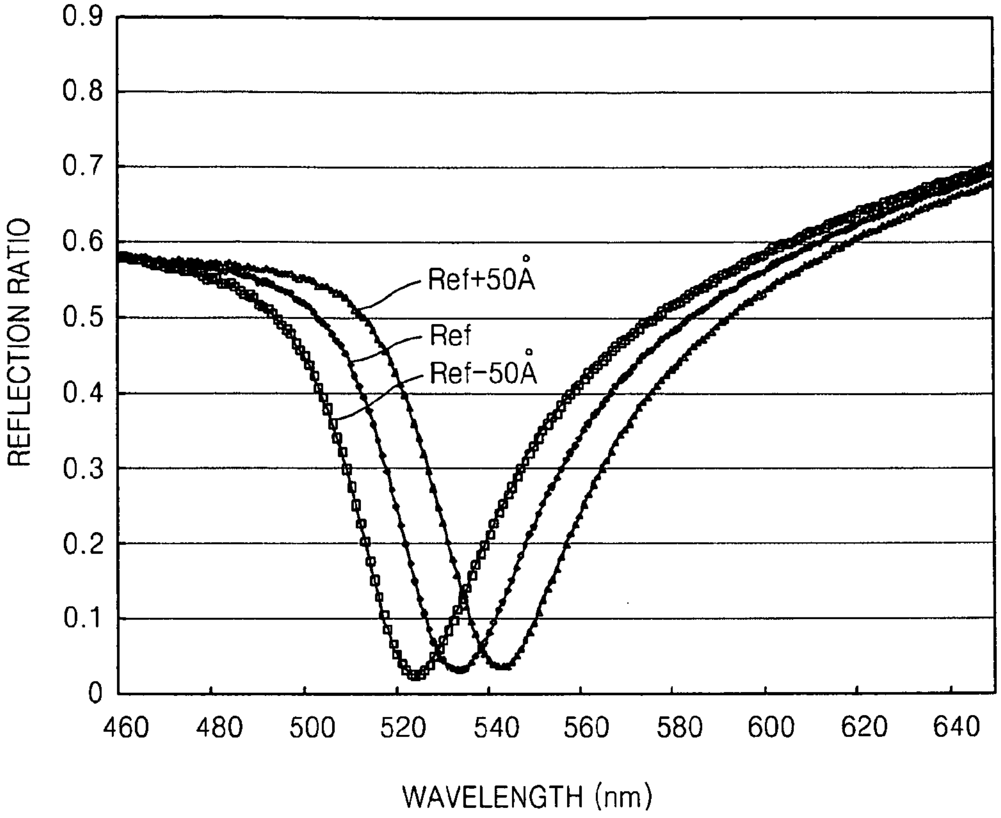
FIGS. 4A through 4C illustrate respective graphs showing spectra of reflected light measured during formation of an organic film layer having a green light emitting layer, a cathode layer, and a capping layer, respectively, by using the apparatus of FIG. 3.
Figure 4B:
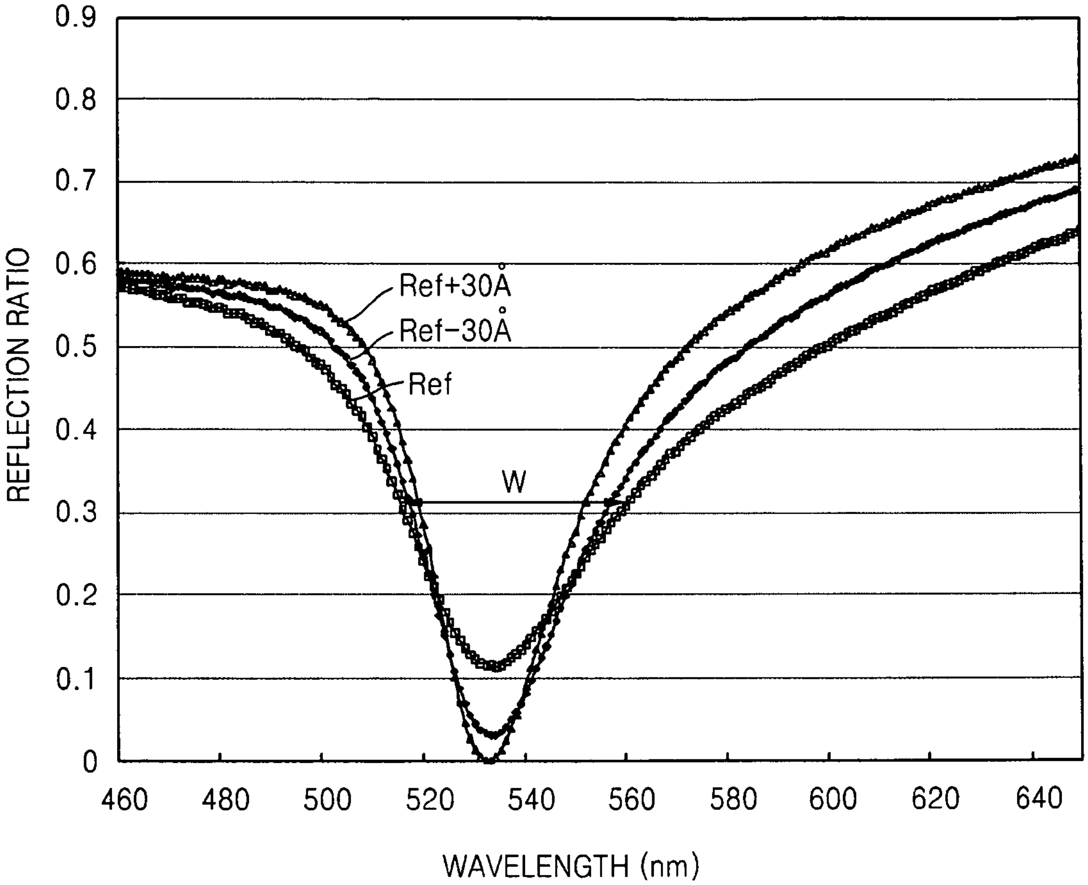
Figure 4C:
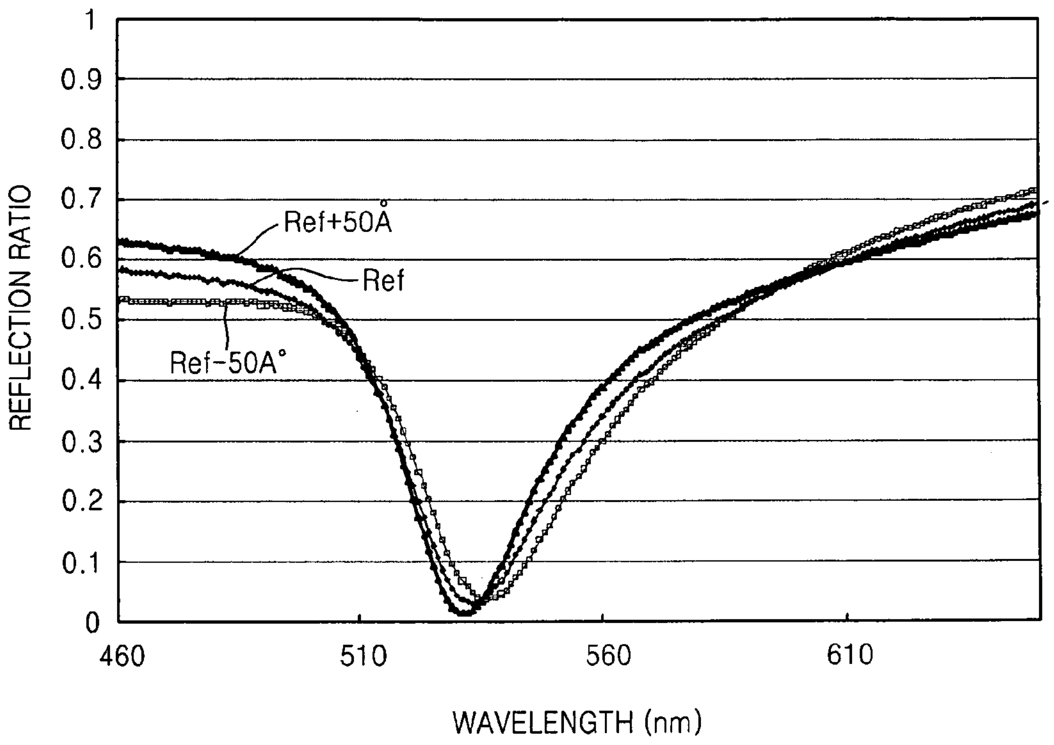

FIGS. 4A through 4C illustrate graphs of spectra of reflected light measured during formation of an organic film layer 12 having a green light emitting layer, the cathode layer 13, and the capping layer 14, respectively, by using the apparatus 100.

In order to measure a spectrum of reflected light of the organic film layer 12, after the organic film layer 12 having a green light emitting layer is deposited in the process chamber 114 of FIG. 2, a resultant product may be conveyed by the returning device 111*a* from the process chamber 114 to the carrying chamber 111. Afterwards, light may be irradiated onto the organic film layer 12 from the reflectometer 151 of the inspector part 150 installed on the carrying chamber 111. Then, the irradiated light that passes through the organic film layer 12 is reflected by the anode layer 11 toward the reflectometer 151. The computer 152 may analyze the light reflected back toward the reflectometer 151 and compare the result to a reference value. For example, as illustrated in FIG. 4A, the computer 152 may detect a shift of about 10 nm of the wavelength peak of the reflected light relative to the reference spectrum, thereby determining about a 50 Å thickness difference between the measured layer and a reference layer.

It is noted that FIG. 4A illustrates two cases, i.e., where an organic film layer 12 has a thickness that is greater than a reference thickness by 50 Å and where an organic film layer 12 has a thickness that is smaller than a reference thickness by 50 Å. As shown in FIG. 4A, when the thickness of the organic film layer 12 changes by 50 Å, the peak wavelength that corresponds to a minimum refractive index of the reflection light shifts by approximately 10 nm. Accordingly, if it is set to determine that a product is defective when the thickness difference of a deposited layer is greater than 50 Å, the computer 152 may determine the product as defective when the peak wavelength of the reflection light shifts more than 10 nm. That is, the product is determined as defective by detecting a specific point at which the spectrum of the reflection light differs from the reference spectrum, and in the case of the organic film layer 12, the comparison of the peak wavelengths is useful for determining a product as defective.

Similarly, in order to measure the spectrum of reflected light of the cathode layer 13, after the cathode layer 13 is deposited in the process chamber 115 of FIG. 2, a resultant product may be conveyed by the returning device 111*a* from the process chamber 115 to the carrying chamber 111. Afterwards, light is irradiated onto the cathode layer 13 from the reflectometer 151 of the inspector part 150 installed on the carrying chamber 111. Then, the light that passes through the cathode layer 13 and the organic film layer 12 is reflected by the anode layer 11 and is received by the reflectometer 151. The analysis result shown in FIG. 4B is of when the computer 152 analyzes the light received by the reflectometer 151. FIG. 4B shows a case when the cathode layer 13 has a thickness that is greater than a reference thickness by 30 Å and a case when the cathode layer 13 has a thickness smaller than a reference thickness by 30 Å. As shown in FIG. 4B, when the thickness of the cathode layer 13 changes by 30 Å, a magnitude of the minimum refractive index varies at the peak wavelength of the reflected light. A full width at half maximum W at the peak wavelength also varies. Accordingly, the computer 152 determines whether the deposition thickness of the product is correct or not according to the magnitude of the minimum refractive index of the reflected light or whether the full width at half maximum W varies greater than a set range or not. That is, in the case of the cathode layer 13, the magnitude of the minimum refractive index of the reflected light or the comparison of the full width at half maximum W is useful for determining the product as defective.

Similarly, in order to measure the spectrum of the reflected light of the capping layer 14, after the capping layer 14 is deposited in the process chamber 122 of FIG. 2, the resultant product may be conveyed by the returning device 121*a* from the process chamber 122 to the carrying chamber 121. Afterwards, light is irradiated onto the capping layer 14 from the reflectometer 151 of the inspector part 150 installed on the carrying chamber 121. Then, the light that passes through the capping layer 14, the cathode layer 13, and the organic film layer 12 is reflected by the anode layer 11 and is received by the reflectometer 151. The analysis result shown in FIG. 4C is of when the computer 152 analyzes the light received by the reflectometer 151. FIG. 4C shows a case when the capping layer 14 has a thickness greater than a reference thickness by 50 Å and a case when the capping layer 14 has a thickness smaller than the reference thickness by 50 Å. As shown in FIG. 4C, when the thickness of the capping layer 14 changes, the location of the peak wavelength, the magnitude of the minimum refractive index, and the full width at half maximum W of the reflected light all vary. Accordingly, the computer 152 determines whether the deposition thickness is correct or not according to the location of the peak wavelength, the magnitude of the minimum refractive index, and the full width at half maximum W of the reflected light. That is, in the case of the capping layer 14, the simultaneous comparison of the location of the peak wavelength, the magnitude of the minimum refractive index, and the full width at half maximum W is useful for determining the product as defective.

As described above, if the product in each deposition process is inspected by analyzing the reflected light, a product failure may be detected in advance, i.e., during the deposition process and before completion thereon. Thus, an appropriate action may be rapidly taken, thereby reducing the failure rate of products.

Figure 5A:
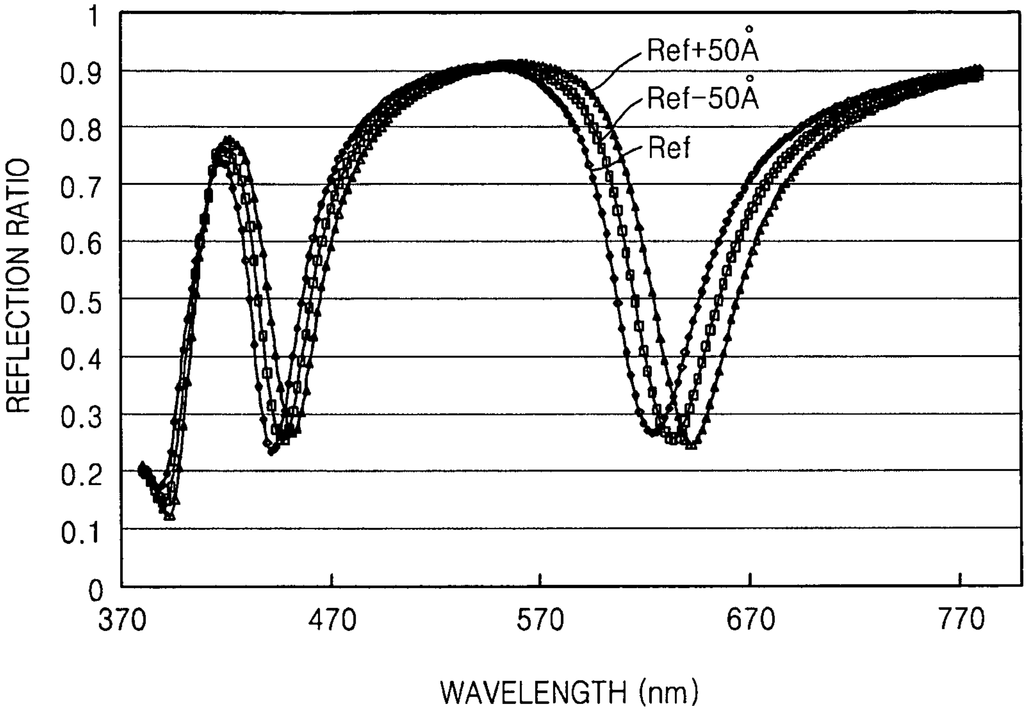
FIGS. 5A and 5B illustrate respective graphs showing spectra of an organic light emitting display panel having a red light emitting layer and an organic light emitting display panel having a blue light emitting layer that are measured using the apparatus of FIG. 3.
Figure 5B:
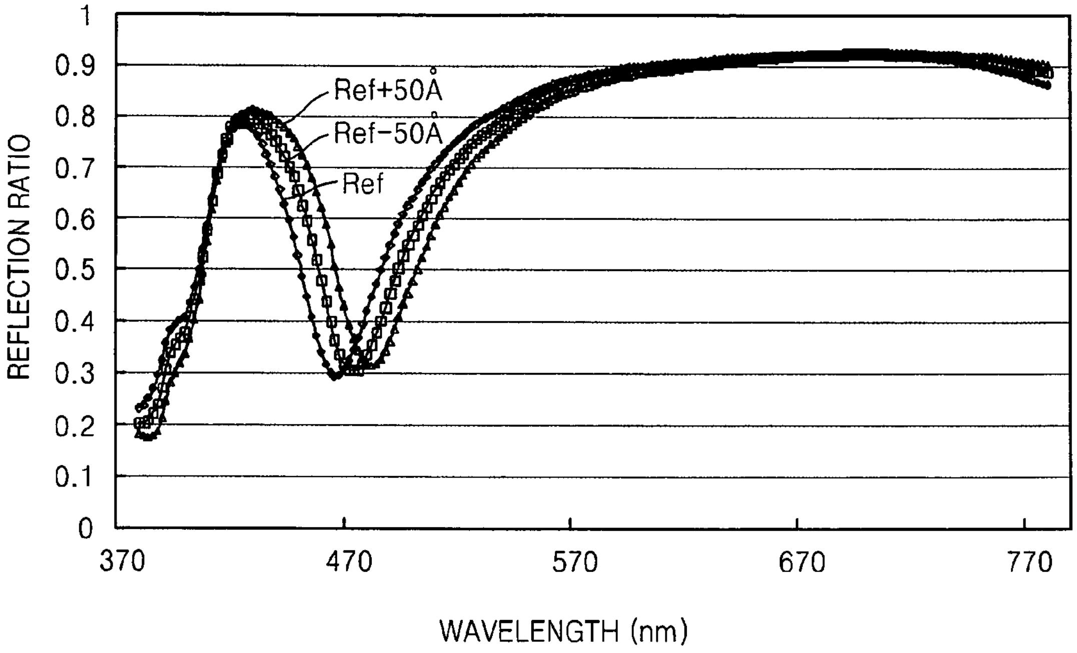

FIG. 5A illustrates a reference spectrum of light reflected from an organic film layer having a red light emitting layer and spectra of light reflected from layers having thicknesses greater and smaller than the reference thickness by 50 Å. FIG. 5B illustrates a reference spectrum of light reflected from an organic film layer having a blue light emitting layer and spectra of light reflected from layers having thicknesses greater and smaller than the reference thickness by 50 Å. Both cases show the changes of spectra of reflected light, and thus, the product may be inspected by comparing the changes of the spectra with the reference spectrum.

A method of depositing and inspecting an organic light emitting display device by using the apparatus 100 for depositing and inspecting an organic light emitting display panel will now be described.

Referring to FIG. 2, the panel 30 on which a TFT is formed may be supplied to the carrying chamber 111 of the first cluster 110 from the panel supply unit 140. Then, the returning device 111*a* of the carrying chamber 111 may sequentially load the panel 30 in the process chambers 112 through 115. After forming the anode layer 11 in the process chambers 112 and 113, and the organic film layer 12 in the process chamber 114, the panel 30 may be moved to the carrying chamber 111. Next, spectra of light reflected from the panel 30 and layers thereon may be measured using the inspector part 150. Here, if any of the films on the panel 30, e.g., the organic film layer 12, is determined as defective by the computer 152, the controller 153 may adjust the process, e.g., issue a command stopping the deposition process on the corresponding panel 30 and removing the panel 30 from the process line. If the films on the panel 30 are determined as not defective by the computer 152, the panel 30 is loaded in the process chamber 115 to deposit the cathode layer 13.

Similarly, after the cathode layer 13 is deposited, the spectrum of light reflected from the panel 30 may be measured in the carrying chamber 111 by using the inspector part 150, and if the panel 30 is determined as not defective, the corresponding panel 30 is moved to the process chamber 122 of the second cluster 120 so as to deposit the capping layer 14. In the same manner, after the capping layer 14 is deposited, the product is inspected in the carrying chamber 121 by measuring the spectrum of the reflection light with the inspector part 150, and if no failure is detected, the corresponding panel 30 is moved to a process of covering the panel 30 with an encapsulation layer 15. After the panel 30 is covered by the sealing substrate 15, the spectrum of the reflection light may further be measured to inspect the panel 30 in terms of whether the panel 30 is correctly sealed or not in the sealing process.

In this way, since the products, i.e., thin film layers, are continuously inspected after each operation of the deposition processes, presence of a defective product may be detected early. Therefore, the defective product may be immediately removed from the process and a warning notice may be generated, thereby reducing the failure rate of products.

In the current embodiment, the top emission type organic light emitting display panel 10 shown in FIG. 1A is described as an example; however, example embodiments are not limited thereto, e.g., example embodiments may also be applied to the bottom emission type organic light emitting display panel 20 shown in FIG. 1B. It is noted, however, that in the case of the bottom emission type organic light emitting display panel 20, a reflection light is measured by irradiating light from the lower side of the anode layer 21. Therefore, the reflectometer 151 of the inspector part 150 may be positioned on a side opposite to the location shown in FIG. 3. Alternatively, the panel 30 may be placed on a lower side of the reflectometer 151 after the panel 30 is reversed by using the returning devices 111*a* and 121*a*.

Also, as described above, the inspector part 150 may be directly installed in the process chambers 112, 113, 114, 115, or 122, besides the carrying chambers 111 and 121, or may be installed in the buffer chamber 130. That is, the inspector part 150 may be installed at any location where the panel 30 passes.

Also, it is noted that while the deposition apparatus 100 is described as having a cluster structure in which the process chambers 112, 113, 114, 115, and 122 surround the carrying chambers 111 and 121, other configurations are included within the example embodiments. For example, the deposition apparatus 100 may have an inline structure in which the process chambers 112, 113, 114, 115, and 122 are disposed in a row, the inspector part 150 may be installed on any location where the panel 30 passes, and the inspection of products may be performed by analyzing the spectrum of reflection light.

Therefore, an apparatus for depositing and inspecting an organic light emitting display panel according to example embodiments may perform inspection of products by analyzing the spectrum of reflection light during the process of deposition, regardless of the shape of the deposition apparatus or the kind of organic light emitting display panel. According to the inspection results, an appropriate action may be taken, thereby reducing the failure rate of products. That is, since a product may be inspected in advance in the course of depositing thin film layers, an appropriate action may be rapidly taken with respect to the deposition process, thereby reducing the failure rate of products and reducing manufacturing costs.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of depositing and inspecting an organic light emitting display panel, the method comprising:

depositing on a panel thin film layers, the thin film layers including an anode layer, an organic film layer, and a cathode layer;

irradiating light onto the thin film layers;

measuring spectra of light reflected from the thin film layers; and determining whether a thickness of individual thin film layers is correct by comparing the measured spectra of reflected light to reference spectra, wherein depositing the thin film layers includes depositing the anode layer, the organic film layer, and the cathode layer sequentially in that order, and the measuring, determining, and controlling are performed after depositing of each of the organic film layer and the cathode layer.

2. The method as claimed in claim 1, wherein determining whether the thickness of the thin film layers is correct includes at least one of determining a change of a location of a peak wavelength, determining a change of a magnitude of a minimum refractive index, and determining a change of a full width at half maximum.

3. The method as claimed in claim 2, further comprising controlling the deposition of the thin film layers on the panel according to a spectra comparison result in the determining.

4. The method as claimed in claim 3, wherein controlling the depositing includes removing a panel determined to have a thin film layer with incorrect thickness and providing a warning notice to an operator.

5. The method as claimed in claim 2, wherein measuring spectra of light and determining correctness of thickness is performed after depositing each of the organic film layer and the cathode layer, wherein correctness of thickness of the organic film layer is determined by determining a change of a location of a peak wavelength, and correctness of thickness of the cathode layer is determined by determining a change of a magnitude of a minimum refractive index.

6. The method as claimed in claim 1, wherein depositing the thin film layers further comprises depositing a protective capping layer on the cathode layer.

7. The method as claimed in claim 6, wherein depositing the thin film layers includes determining correctness of thickness of the protective capping layer, after determining correctness of the cathode layer, by irradiating light and comparing spectra of reflected light.

8. The method as claimed in claim 1, wherein measuring the spectrum of light includes irradiating light onto the thin film layers in a direction oriented from the cathode layer to the anode layer.

9. The method as claimed in claim 1, wherein measuring the spectrum of light includes irradiating light onto the thin film layers in a direction oriented from the anode layer to the cathode layer.

10. The method as claimed in claim 1, wherein depositing the thin film layers includes determining correctness of thickness of at least the organic film layer and the cathode layer, after each of their respective depositions.

11. The method as claimed in claim 1, wherein measuring spectra of light reflected from the thin film layers includes determining reflection ratio as a function of wavelength, the wavelength corresponding to wavelengths of visible light.

12. A method of depositing and inspecting an organic light emitting display panel, the method comprising:

depositing on a panel an anode layer and an organic film layer;

irradiating light onto the organic film layer;

measuring spectra of light reflected from the organic film layer;

determining whether a thickness of the organic film layer is correct by comparing a location of a peak wavelength of the measured spectra to a reference spectra;

depositing a cathode layer on the organic film layer, after the thickness of the organic film layer is determined as correct;

irradiating light onto the cathode layer;

measuring spectra of light reflected from the cathode layer to determine a minimum refractive index; and determining whether a thickness of the cathode layer is correct by comparing the determined minimum refractive index to a reference refractive index.

* * * * *